Figure 1:
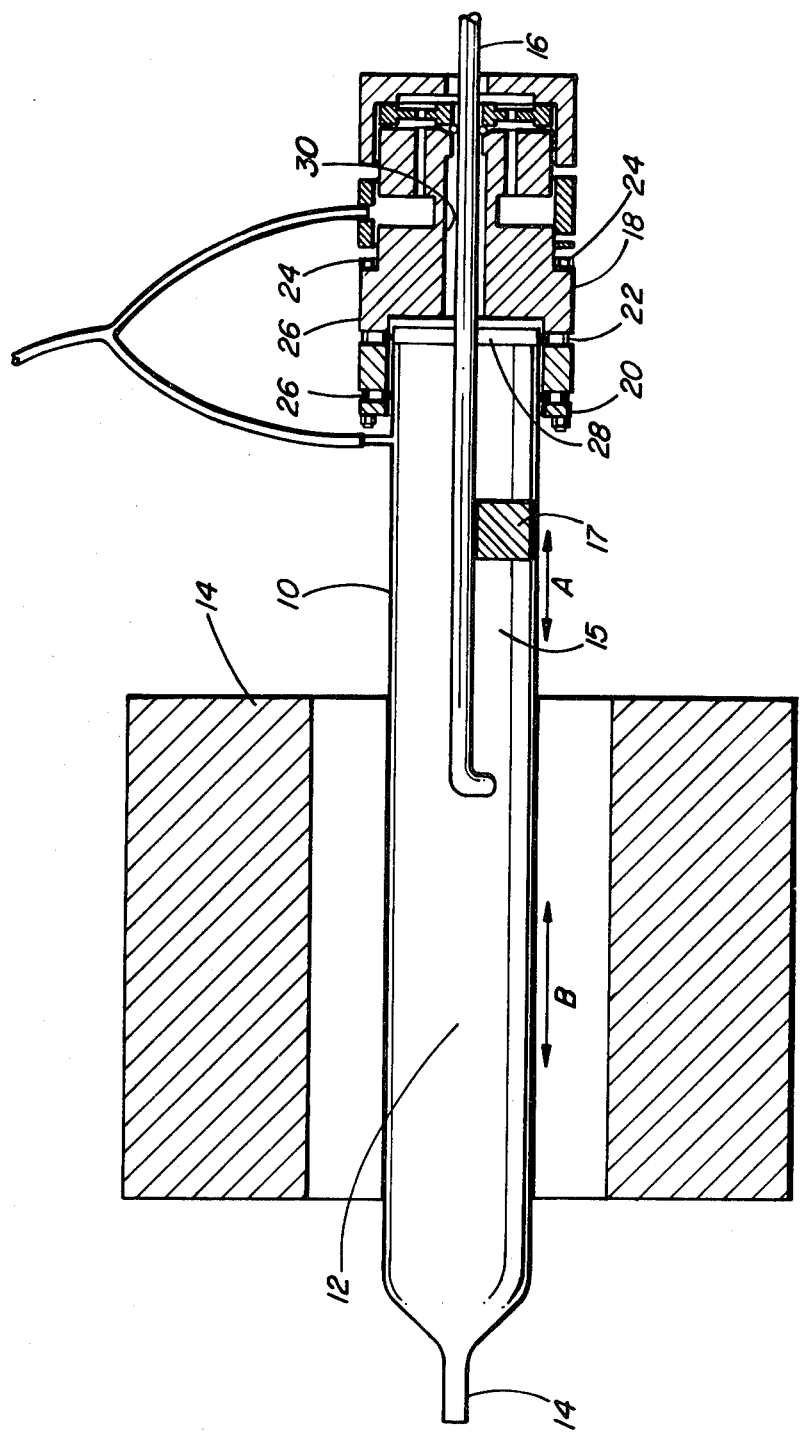

United States Patent [19]

Devenyi et al.

[11] Patent Number: 4,483,541
[45] Date of Patent: Nov. 20, 1984

[54] GAS SEAL FOR SEMICONDUCTOR PROCESSING EQUIPMENT

[75] Inventors: Tibor F. Devenyi; Iwona Turlik, both of Nepean, Canada

[73] Assignee: Northern Telecom Limited, Montreal, Canada

[21] Appl. No.: 597,040

[22] Filed: Apr. 5, 1984

[51] Int. Cl.³ .............................................. F16J 15/40
[52] U.S. Cl. ......................................... 277/3; 277/27
[58] Field of Search ........................ 277/3, 27, 1, 70, 2

[56] References Cited

U.S. PATENT DOCUMENTS

| | | | |
|---|---|---|---|
| 3,868,104 | 2/1975 | Hunt et al. | 277/DIG. 1 |
| 3,975,123 | 8/1976 | Schibbye | 277/70 |
| 4,245,844 | 1/1981 | Pohl et al. | 277/3 |
| 4,399,997 | 8/1983 | Broken | 277/27 |
| 4,412,683 | 11/1983 | Haney | 277/3 |
| 4,431,199 | 2/1984 | Iwane | 277/3 |
| 4,432,556 | 2/1984 | Green et al. | 277/3 |
| 4,451,046 | 5/1984 | Bliven | 277/3 |

Primary Examiner—Robert I. Smith
Attorney, Agent, or Firm—Stuart L. Wilkinson

[57] ABSTRACT

During production of laser diodes, crystals on which the laser diodes are formed are subjected to two high temperature processes: diffusion and alloying. These steps are performed in a quartz process tube in an oxygen free atmosphere. At some stage in the process the crystal must be moved from a cool zone to a hot zone within the tube and this is done by means of a push rod which extends through an aperture in the diffusion tube. The conventional arrangement for sealing around the push rod acts to clamp the push rod in position. Thus, temporarily, while the push rod is being moved the seal must be partly released and its sealing action is inferior. To maintain the process atomsphere free of reactive gas there is proposed by the invention a mechanism for flooding the sealing area between the push rod and the process tube with an inert gas while the sealing means is temporarily released.

8 Claims, 2 Drawing Figures

GAS SEAL FOR SEMICONDUCTOR PROCESSING EQUIPMENT

This invention relates to equipment used in the production of semiconductor devices such as laser diodes.

During production of laser diodes, crystals on which the laser diodes are formed are subjected to two high temperature processes: diffusion and alloying. Both steps are usually performed in a quartz process tube in a dry oxygen-free nitrogen atmosphere. It is important to keep the oxygen content of the nitrogen process gas as low as possible during the high temperature phase of the diffusion or alloying processes. This is particularly true for the diffusion process where the crystal surfaces are not metallized and so are totally unprotected. In the diffusion stage, oxygen can diffuse into the device and degrade device performance. In the alloying stage, oxygen can cause surface oxidation so producing an inferior contact interface.

In standard equipment used for these high temperature operations, a quartz boat containing the crystal is placed in a cold zone of a process tube and the tube entrance is sealed using an end cap and a collet which is screwed down against an O-ring to seal the space between the push rod and the end cap. The process tube is then purged for several hours until the oxygen content of the exhausting gas shows acceptably low levels. The collet is then temporarily loosened to permit the quartz boat containing the crystal, and the diffusion source if applicable, to be moved by means of the push rod to a hot zone of the process tube. The collet is then tightened. After a predetermined time necessary to achieve the required diffusion or alloying effect, the collet is again loosened, the boat withdrawn to the cooler zone of the process tube and the collet re-tightened. When the crystal is sufficiently cooled, the process tube is opened by removing the end cap, and the crystal and boat are unloaded.

It is possible to achieve low oxygen levels of the order of about 4.5 parts per million in the process tube after 1½ hours of purging or out-gassing. That level approaches the background oxygen level of 2.5 parts per million which can be achieved from a bottled nitrogen source. However, moving the crystal to the hot zone at the start of the diffusion or alloying requires the loosening of the collet to allow the push rod movement through the O-ring. This permits entry of atmospheric oxygen and water vapour which can increase the oxygen level within the process tube to greater than 50 parts per million.

To overcome this problem, the invention provides equipment for use in the production of semiconductor devices comprising a chamber having first and second zones, a push rod for moving objects within the chamber between the zones, the push rod extending into the chamber through an aperture in a wall thereof, sealing means for sealing a junction region between the push rod and the wall, a clamping arrangement for clamping the sealing means, such clamping acting also to fix the push rod, and means for flooding the sealing means with an inert gas while the clamping arrangement is released to permit movement of the push rod, the flood of inert gas functioning to prevent reactive gas from penetrating past the sealing means into the chamber.

Preferably the equipment includes inert gas distributing means acting to direct the inert gas along the surface of the push rod.

The chamber can be defined by a quartz tube having end caps, one of the end caps having an aperture extending therethrough. The clamping arrangement can comprise a collet which fits over and screw-threadedly engages the end cap. The collet can be turned to press an intermediate spacer member against an O-ring whereby to press the O-ring against the push rod and the seal body member and so seal a space therebetween. The end cap and the spacer member can have inert gas distribution conduits extending therethrough whereby to direct inert gas against the sealing member and the push rod on the outside of the chamber. The equipment can have a single source of inert gas to supply both the interior of the chamber and the distribution conduits.

According to another aspect of the invention, there is provided a method for sealing equipment for use in the production of semiconductor devices, the equipment having a reaction chamber through a wall of which extends a push rod, the equipment having a sealing means between the push rod and the wall, the sealing means providing a high degree of sealing while the push rod is fixed but providing a relatively inferior seal when the push rod is released to allow movement of objects within the reaction chamber, the method comprising flooding the sealing means and a part of the push rod projecting outwardly from the sealing means with an inert gas.

Figure 2:
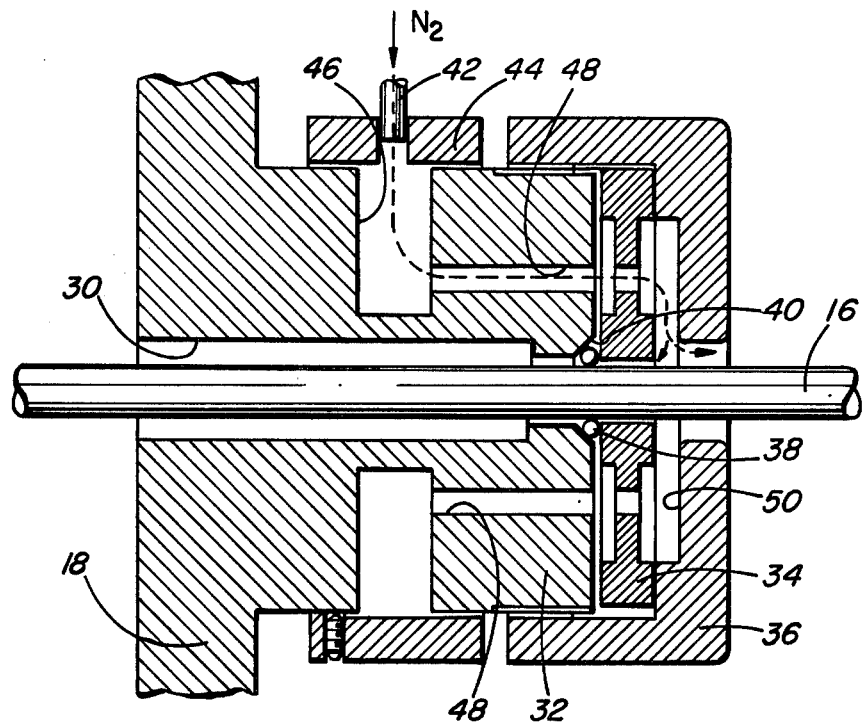

An embodiment of the invention will now be described by way of example with reference to the accompanying drawings in which:

FIG. 1 shows a longitudinal sectional view through processing equipment according to the invention; and FIG. 2 shows a detail to a larger scale of the FIG. 1 equipment.

Referring to FIG. 1 in detail, there is shown a quartz process tube 10 having a first hot zone 12 surrounded by a furnace 14 and a cool zone 15. Located in the cool zone is a quartz boat 17 containing a semiconductor crystal and a diffusion source. To obtain a desired diffusion of the diffusion source into the crystal, the materials in the boat must be subjected to a high temperature of the order of 525° C. for a precise time depending on the desired diffusion depth. In order to expose the crystal to diffusion conditions for exactly the period required for the desired diffusion depth, the boat 17 is normally kept within the cool zone 15 while the quartz tube 10 is purged of any contaminants such as oxygen or water vapour and the furnace is powered to bring the hot zone 12 to the desired temperature. Typically a flow of nitrogen gas is maintained for several hours until the gas exhausted from the outlet tube 14 shows on oxygen content of less than two parts per million.

The right-hand end of the process tube is sealed by an end cap arrangement through which a push rod 16 extends. The end cap arrangement includes a stainless steel end cap 18, and a pair of stainless steel rings 20 and 22. The rings and the end cap are fixed together by several bolts 24. The bolts act to bias and seal resilient O-rings 26 against the outside surface of the quartz process tube 10. Within the tube is mounted a quartz support member 28 for the push rod 16 which is also made of quartz. The push rod 16 extends back through an aperture 30 through the end cap 18, the end cap arrangement being shown in greater detail and to a larger scale in FIG. 2.

Referring in detail to FIG. 2, near the right hand or outer end of the cap, the bore 30 narrows to a diameter only marginally larger than the outside diameter of the push rod 16. Adjacent an end surface of end cap extension 32 is a stainless steel spacer member 34 and adjacent the outer surface of the spacer member is a stainless steel collet 36. The collet 36 screw-threadedly engages an outer surface of the end cap extension 32. When the collet is screwed down on the end cap extension, the spacer member 34 bears against an O-ring 38 which surrounds the push rod 16 and bears against a bevelled portion 40 of the cap extension 32. By screwing down the collet, a seal is achieved between the end cap 18 and the push rod 16 to prevent the ingress of reactive gases which, at the process temperatures within the quartz tube hot zone, would seriously contaminate the crystal.

Unfortunately the sealing action of the O-ring 38 also acts to fix the push rod 16 so preventing the quartz boat 17 from being moved within the reaction tube 10. In order to move the push rod 16, the collet 36 is unscrewed slightly to take the pressure off the O-ring 38. This also reduces the effectiveness of the seal around the push rod 16 and reactive gas can penetrate into the reaction tube 10.

To prevent ingress of reactive gases, and especially of oxygen, the end cap arrangement has a series of conduits by means of which inert gas is delivered to the region of the O-ring 38 and floods both the O-ring and the surface of the push rod 16 projecting from the end cap extension 32. The conduit arrangement includes a gas inlet tube 42 which is mounted within a stainless steel sealing ring 44. The inert gas enters the end cap extension 32 through a gallery 46 extending around the end cap extension and is fed through bores 48 in the end cap extension 32 and in the spacer member 34 to a recess 50 in the collet 36. The recess diverts the gas towards the push rod 16 and at the push rod, part of the gas flows into the space between the spacer member 34 and the O-ring 38 and part is directed along the surface of the push rod 16 towards the outside of the end cap arrangement. Finally a small amount of inert gas is directed radially towards the O-ring 38 along the space between the spacer member 34 and the cap extension 32.

As indicated in FIG. 1 the inert gas delivered to the end cap arrangement is derived from the same source as that used to purge and provide an inert atmosphere in the process tube 10.

With the arrangement shown in FIG. 2, a reduction from greater than 50 parts per million to 4 parts per million of oxygen in the process atmosphere has been achieved in the period immediately following actuation of the push rod 16.

What is claimed is:

1. Equipment for use in the production of semiconductor devices comprising a chamber having first and second zones, a push rod for moving objects within the chamber between the zones, the push rod extending into the chamber through an aperture in a wall thereof, sealing means for sealing a junction region between the push rod and the wall, a clamping arrangement for clamping the sealing means, such clamping acting also to fix the push rod, and means for flooding the sealing means with an inert gas while the clamping arrangement is released to permit movement of the push rod, the flood of inert gas functioning to prevent reactive gas from penetrating past the sealing means into the chamber.

2. Equipment as claimed in claim 1 further comprising conduit means for directing the inert gas along a surface of the push rod.

3. Equipment as claimed in claim 1 wherein the chamber is defined by a quartz tube having end caps, one of the end caps having the aperture extending therethrough.

4. Equipment as claimed in claim 3, the clamping arrangement having a collet which fits over and screw threadedly engages a part of the end cap, the collet when screwed down acting to bias an O-ring against the push rod and so seal a gap between the push rod and the wall.

5. Equipment as claimed in claim 4 in which the collet is spaced from the O-ring by an intermediate spacer member which contacts and biases the O-ring when the collet is screwed down.

6. Equipment as claimed in claim 5, the end cap and the spacer member having inert gas distribution conduits extending therethrough whereby to direct inert gas against the sealing member and the push rod on the outside of the chamber.

7. Equipment as claimed in claim 6 in which a single source of inert gas supplies both the interior of the chamber and the distribution conduits.

8. Equipment as claimed in claim 7 in which the end cap, spacer member and collet are of stainless steel and the push rod is made of quartz.

* * * * *